United States Patent
Tsai et al.

(10) Patent No.: US 8,081,774 B2
(45) Date of Patent: Dec. 20, 2011

(54) CIRCUIT FOR ELIMINATING POP SOUNDS AT POWER ON AND OFF BY A MODERATE WAVEFORM

(75) Inventors: Ming-Hung Tsai, Fongshan (TW); Tung-Tsai Liao, Hsinchu (TW)

(73) Assignee: Generalplus Technology Inc., Hsinchu (TW)

( * ) Notice: Subject to any disclaimer, the term of this patent is extended or adjusted under 35 U.S.C. 154(b) by 990 days.

(21) Appl. No.: 12/068,145

(22) Filed: Feb. 4, 2008

(65) Prior Publication Data

US 2008/0204122 A1    Aug. 28, 2008

(30) Foreign Application Priority Data

Feb. 27, 2007   (TW) ................................ 96106747 A

(51) Int. Cl.
*H04R 5/00* (2006.01)
(52) U.S. Cl. ........................................................ 381/94.5
(58) Field of Classification Search ............. 381/90–94, 381/94.5, 104, 111
See application file for complete search history.

(56) References Cited

U.S. PATENT DOCUMENTS

| | | | | |
|---|---|---|---|---|
| 4,000,489 A | * | 12/1976 | Bench | 340/384.72 |
| 5,189,241 A | * | 2/1993 | Nakamura | 84/728 |
| 5,754,668 A | * | 5/1998 | Funahashi et al. | 381/101 |
| 5,757,305 A | * | 5/1998 | Xydis | 341/173 |
| 6,144,290 A | * | 11/2000 | Duval et al. | 324/520 |
| 6,204,789 B1 | * | 3/2001 | Nagata | 341/144 |
| 6,734,837 B1 | * | 5/2004 | Havel | 345/83 |
| 6,947,564 B1 | * | 9/2005 | Hoover | 381/1 |
| 7,046,082 B2 | * | 5/2006 | Komiya et al. | 330/51 |
| 7,164,774 B2 | * | 1/2007 | Inoue | 381/109 |
| 2005/0084120 A1 | * | 4/2005 | Hagino | 381/120 |
| 2008/0205672 A1 | * | 8/2008 | Aisu | 381/120 |
| 2010/0003033 A1 | * | 1/2010 | Holmes | 398/141 |

* cited by examiner

*Primary Examiner* — Nathan Ha
(74) *Attorney, Agent, or Firm* — Bacon & Thomas, PLLC

(57) ABSTRACT

A circuit for eliminating pop sounds at power on and off by a moderate waveform, which includes a switch, a feedback network, an operational amplifier and an output network. When power-on, a first input terminal of the switch is connected to a low voltage, and an output terminal of the output network provides an operating DC bias which is gradually increased. When power-off, the first input terminal of the switch is connected to a reference voltage, and the output terminal of the output network provides an operating DC bias which is gradually reduced.

16 Claims, 6 Drawing Sheets

CIRCUIT FOR ELIMINATING POP SOUNDS AT POWER ON AND OFF BY A MODERATE WAVEFORM

BACKGROUND OF THE INVENTION

1. Field of the Invention

The present invention relates to a circuit for eliminating noises at power on and off and, more particularly, to a circuit for eliminating pop sounds at power on and off by a moderate waveform.

2. Description of Related Art

Upon the rapid advance of electronic technology, multimedia applications are increasingly complicated. In addition to the requirement of image quality, the sound quality is required higher and higher. FIG. 1 is a schematic diagram of a typical sound signal. As shown in FIG. 1, due to the sampling, the range of the sound signal is from positive voltage to negative voltage. However, an operating voltage for a typical integrated circuit (IC) ranges from zero to $V_{DD}$ volts, and the sound signal is biased to $V_{DD}/2$.

When the sound signal is biased, it directly adds a DC bias $V_{DD}/2$ and the sound signal, which can cause a pop noise sounding "Bo" at power on due to the discontinuous DC operating voltage. Likewise, the DC operating voltage for the sound signal at power off is rapidly reduced from $V_{DD}/2$ volts to zero, and the pop noise "Bo" is present. As shown in FIGS. 2A and 2B, when an output voltage of a digital to analog converter (DAC) is changed from zero to $V_{DD}/2$ volts, the DAC adds the internal sound signal to the DC operating voltage. Such a way gradually increases the DC operating voltage from zero to $V_{DD}/2$ volts, so the pop noise is not clearly present except for the positions B and C where the DC operating voltage is discontinuous. In addition, the DC operating voltage is increased exponentially, not linearly, when the DAC adjusts the DC operating voltage from zero to $V_{DD}/2$ volts. This may cause slight noises. Further, the entire system response speed is typically limited by the DAC, and the system cannot be powered on or off rapidly. For rapid power-on or -off, it requires a DAC with the fast response speed, which relatively increases the system cost.

SUMMARY OF THE INVENTION

An object of the present invention is to provide a circuit for eliminating pop sounds at power on and off by a moderate waveform, which can reduce the pop sounds and slight noises produced at power on or off.

Another object of the present invention is to provide a circuit for eliminating pop sounds at power on and off by a moderate waveform, which can increase the system response speed to thereby save the cost.

In accordance with one aspect of the present invention, there is provided a circuit for eliminating pop sounds at power on and off by a moderate waveform. The circuit includes a switch, a feedback network, an operational amplifier and an output network. The switch has a first input terminal connected to a low voltage and a second input terminal connected to a reference voltage for switching at power on or off. The feedback network is connected to the switch in order to provide a feedback current, and has a first resistor and a second resistor. The second resistor has one terminal connected to the switch and the other terminal connected to one terminal of the first resistor. The operational amplifier has a negative input terminal connected to the first resistor and the second resistor and an output terminal connected to the other terminal of the first resistor. The output network has an output terminal, a third resistor, a fourth resistor and a capacitor. The third resistor has one terminal connected to the output terminal of the operational amplifier and the other terminal connected to the output terminal of the output network, one terminal of the fourth resistor, one terminal of the capacitor and a positive input terminal of the operational amplifier. The fourth resistor has the other terminal connected to the low voltage. The capacitor has the other terminal connected to the low voltage. When the switch is connected to the low voltage, the output terminal of the output network provides an operating DC bias, which is gradually increased, to the circuit.

In accordance with another aspect of the present invention, there is provided a circuit for eliminating pop sounds at power on and off by a moderate waveform. The circuit includes a switch, a feedback network, an operational amplifier and an output network. The switch has a first input terminal connected to a low voltage and a second input terminal connected to a reference voltage for switching at power on or off. The feedback network is connected to the switch in order to provide a feedback current, and has a first resistor, a second resistor and a fifth resistor. The second resistor has a first terminal connected to the switch and a second terminal connected to first terminals of the first resistor and the fifth resistor. The fifth resistor has a second terminal connected to the low voltage. The operational amplifier has a negative input terminal connected to the first terminal of the first resistor, the second terminal of the second resistor and the first terminal of the fifth resistor, and an output terminal connected to a second terminal of the first resistor. The output network has an output terminal and is comprised of a third resistor, a fourth resistor and a capacitor. The third resistor has a first terminal connected to the output terminal of the operational amplifier and a second terminal connected to the output terminal, a first terminal of the fourth resistor, a first terminal of the capacitor and a positive input terminal of the operational amplifier. The fourth resistor has a second terminal connected to the low voltage. The capacitor has a second terminal connected to the low voltage. When the switch is connected to the low voltage, the output terminal of the output network provides an operating DC bias, which is gradually increased, to the circuit.

Other objects, advantages, and novel features of the invention will become more apparent from the following detailed description when taken in conjunction with the accompanying drawings.

DETAILED DESCRIPTION OF THE PREFERRED EMBODIMENT

Figure 1:
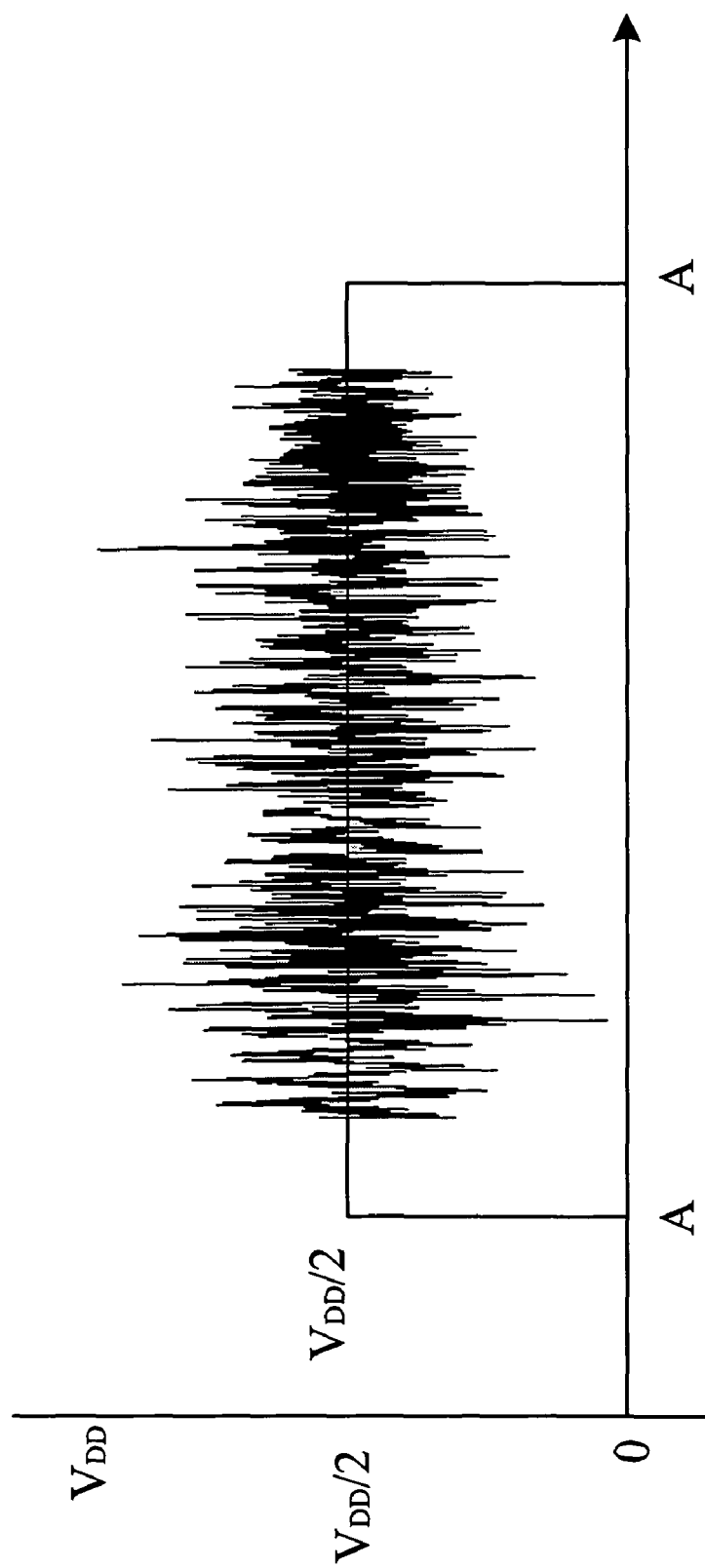
FIG. 1 is a schematic graph of a typical sound signal.
Figure 2A:
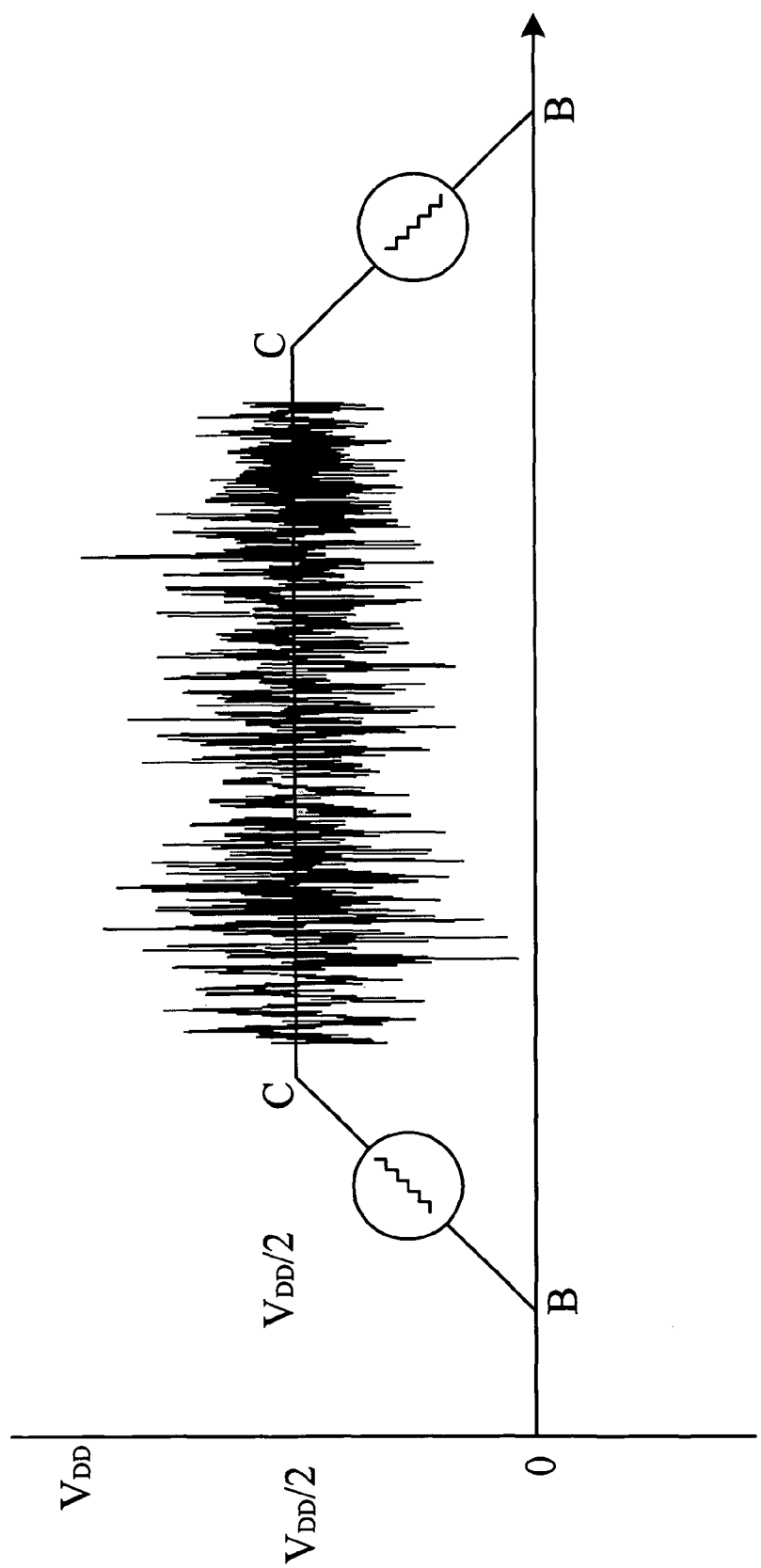
FIGS. 2A and 2B are a schematic graphs of a sound signal typically biased by a DC operation bias.
Figure 2B:
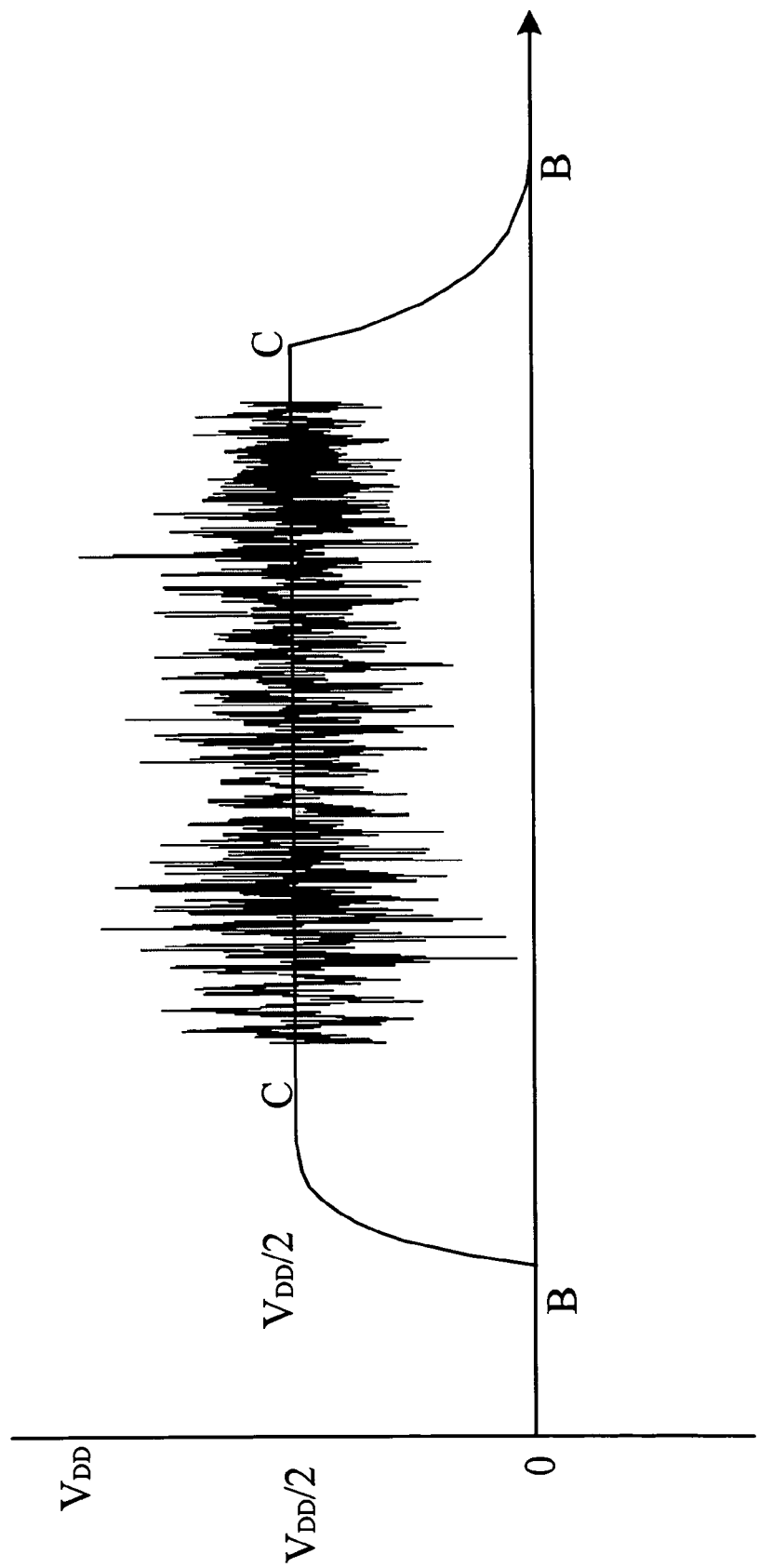
Figure 3:
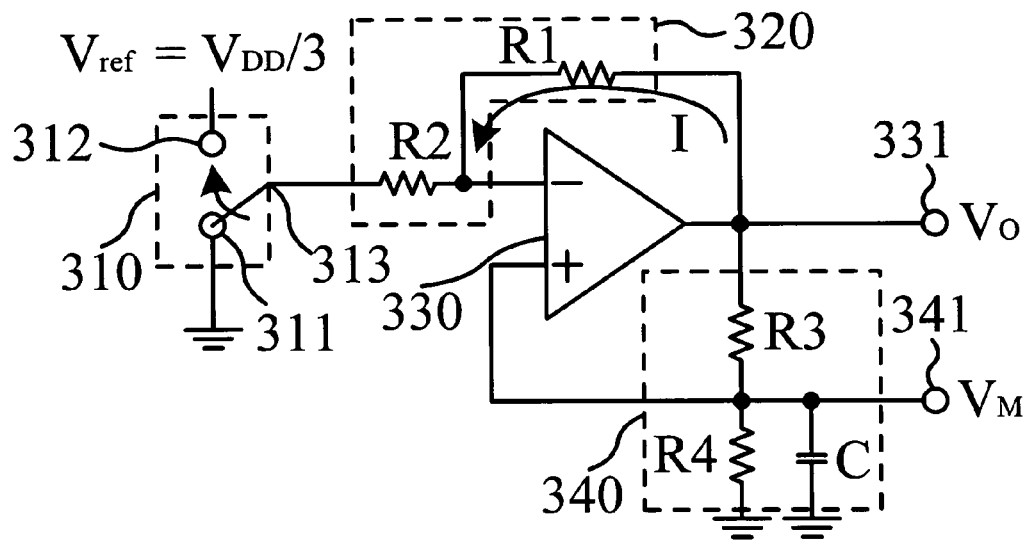
FIG. 3 is a diagram of a circuit for eliminating pop sounds at power on and off in accordance with the invention.

FIG. 3 is a diagram of a circuit for eliminating pop sounds at power on and off by a moderate waveform in accordance with the invention. In FIG. 3, the circuit includes a switch 310, a feedback network 320, an operational amplifier 330 and an output network 340.

The switch 310 has a first input terminal 311 connected to a low voltage and a second input terminal 312 connected to a reference voltage Vref for switching at power on or off of the circuit. When power-on, the switch 310 connects the output terminal 313 to the low voltage. When power-off, the switch 310 connects the output terminal 313 to the reference voltage Vref. The reference voltage Vref is one third of a high voltage $V_{DD}$.

The feedback network 320 is connected to the switch 310 in order to provide a feedback current I. The feedback network 320 is comprised of a first resistor R1 and a second resistor R2. The second resistor R2 has one terminal connected to the switch 310 and the other terminal connected to one terminal of the first resistor R1. The value of first resistor is triple of the value of second resistor.

The operational amplifier 330 has a negative input terminal connected to the first resistor R1 and the second resistor R2, and an output terminal 331 connected to the other terminal of the first resistor R1 and provides an output voltage $V_O$.

The output network 340 has an output terminal 341. The output network 340 is comprised of a third resistor R3, a fourth resistor R4 and a capacitor C. The third resistor R3 has one terminal connected to the output terminal 331 of the operational amplifier 330, and the other terminal connected to the output terminal 341, one terminal of the fourth resistor R4, one terminal of the capacitor C and a positive input terminal of the operational amplifier 330. The fourth resistor R4 has the other terminal connected to the low voltage. The capacitor C has the other terminal connected to the low voltage. The third resistor R3 and the fourth resistor R4 have a same value.

When power-on, the output terminal 313 of the switch 310 is connected to the low voltage, and the circuit is provided with an operating bias $V_M$, which is gradually increased, by the output terminal 341 of the output network 340. When power-off, the output terminal 313 of the switch 310 is connected to the reference voltage Vref, which is equal to $V_{DD}/3$, and the circuit gradually reduces the operating bias $V_M$ at the output terminal 341 of the output network 340.

Figure 4:
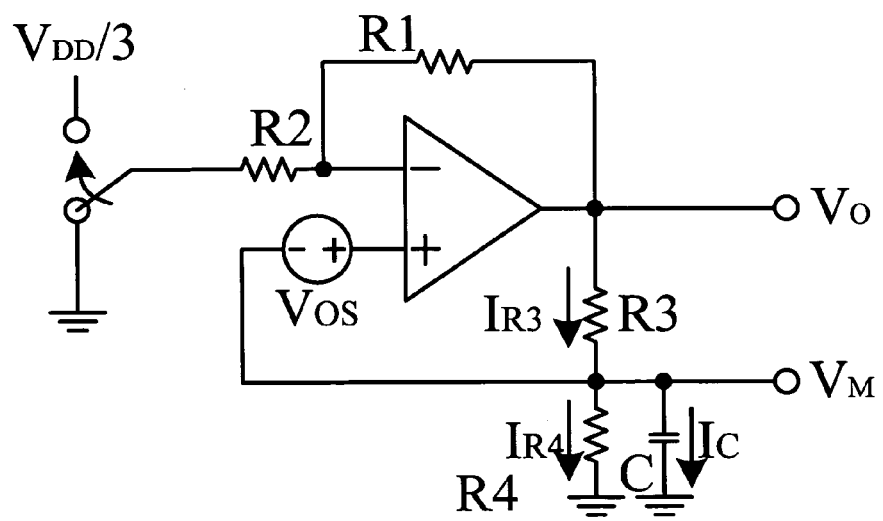
FIG. 4 is a diagram of an output voltage of the circuit of FIG. 3 in accordance with the invention.

When the circuit is powered on and the output terminal 313 of the switch 310 is connected to the low voltage, the operating bias $V_M$ is an exponential function. FIG. 4 is a diagram of the operating bias $V_M$ at the output terminal 341 of the circuit of FIG. 3 in accordance with the invention, where $V_{OS}$ is setup to avoid a startup failure. Accordingly, $V_{OS}$ is a positive voltage at ramp up and a negative voltage at ramp down. Namely, when the operating bias $V_M$ is greater than and equal to zero and small than one fourth of the high voltage $V_{DD}$, we have $$V_M = 2V_{OS} \cdot (e^{\frac{2t}{RC}} - 1),$$

where $V_{OS}$ indicates an input offset voltage of the operational amplifier 330, R indicates a value of the third resistor and C indicates a value of the capacitor.

When the operating bias $V_M$ is greater than and equal to one fourth of the high voltage $V_{DD}$ and small than one half of the high voltage $V_{DD}$, the operating bias $V_M$ is equal to $$\frac{V_{DD}}{4} \cdot (1 - e^{-\frac{2t}{RC}}) + \frac{V_{DD}}{4},$$

where $V_{DD}$ indicates the high voltage, R indicates a value of the third resistor and C indicates a value of the capacitor.

Figure 5:
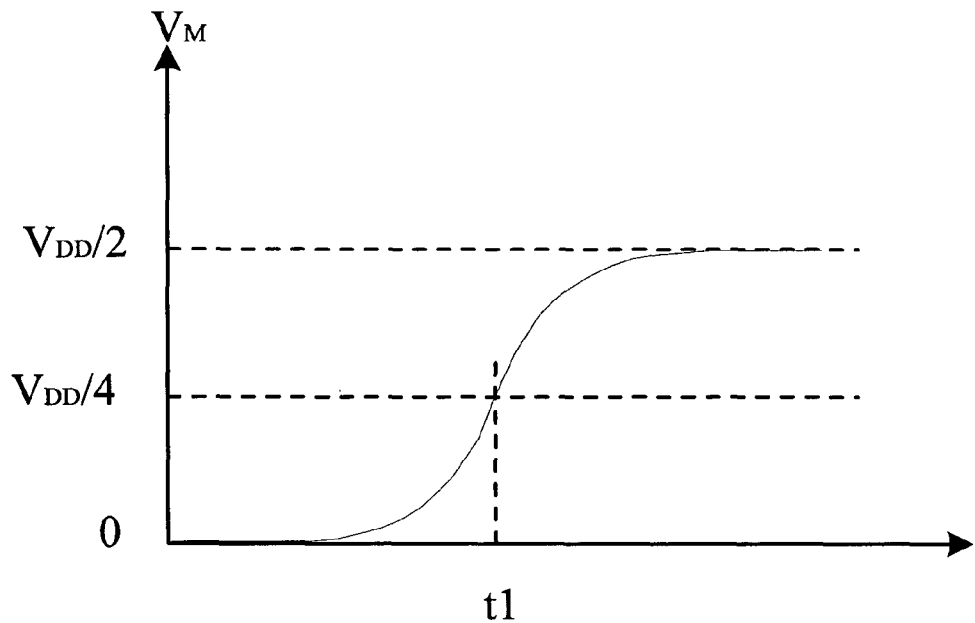
FIG. 5 is a schematic graph of an operating bias computed at power on in accordance with the invention.

FIG. 5 is a schematic graph of the operating bias $V_M$ computed at power on in accordance with the invention. A signal plane for a typical single power audio amplifier is set to $V_{DD}/2$ for obtaining the maximum voltage swing. Accordingly, the third resistor R3 and the fourth resistor R4 are set to a same value to thereby obtain a symmetric double log waveform at $V_{DD}/4$. In this case, the operational amplifier 330 has a negative feedback gain of four. Namely, the first resistor R1 has a value triple of the second resistor R2 (R1/R2=3).

While powering on, when the operating bias $V_M$ is greater than or equal to zero and smaller than one fourth of the high voltage $V_{DD}$ ($0 \leq V_M < V_{DD}/4$), the input offset voltage $V_{OS}$ is greater than zero ($V_{OS} > 0$), the switch 310 connects the output terminal 313 to the low voltage (VMC=Ground), R1/R2=3, R3=R4=R, and the operating bias $V_M$ on the output terminal 341 is initialized at zero ($V_M(0)=0$), the operating bias $V_M$ is derived as follows:

$$V_O = \left(1 + \frac{R1}{R2}\right) \times (V_M + V_{OS}) = 4(V_M + V_{OS}), \quad (1)$$

$$I_{R3} = \frac{V_O - V_M}{R3} = \frac{3V_M + 4V_{OS}}{R},$$

$$I_{R4} = \frac{V_M}{R4} = \frac{V_M}{R},$$

$$I_C = C\frac{dV_M}{dt} = I_{R4} - I_{R3} = \frac{2V_M + 4V_{OS}}{R},$$

$$C\frac{dV_M}{dt} - \frac{2V_M + 4V_{OS}}{R} = 0,$$

$$\frac{dV_M}{dt} - \frac{2}{RC}(V_M + 2V_{OS}) = 0.$$

Equation (1) is a first-order differential equation, which is expressed as $$\frac{dy}{dt} - \alpha y = 0$$

and has the solution expressed as $y = K \cdot e^{\alpha t}$ for $K = y(0)$ in generic. Let $x = V_M + 2V_{OS}$, it is derived that $dx = dV_M$ and $x(0) = 2V_{OS}$. Therefore, equation (1) is rewritten as:

$$\frac{dx}{dt} - \frac{2}{RC}x = 0. \quad (2)$$

From equation (2), it is known that $$x = K \cdot e^{\frac{2t}{RC}}, \quad K = x(0) = 2V_{OS}. \quad (3)$$

Accordingly, by taking $x=V_M+2V_{OS}$ into equation (3), equation (4) can be obtained as:

$$V_M = 2V_{OS} \cdot (e^{\frac{2t}{RC}} - 1). \tag{4}$$

While powering on, when the operating bias $V_M$ ranges from one fourth to one half of the high voltage $V_{DD}$ ($V_{DD}/4 \leq V_M \leq V_{DD}/2$), the input offset voltage $V_{OS}$ is greater than zero ($V_{OS}>0$), the switch 310 connects the output terminal 313 to the low voltage (VMC=Ground), R1/R2=3, R3=R4=R, and the operating bias $V_M$ on the output terminal 341 is initialized at $V_{DD}/4$ volts ($V_M(0)=V_{DD}/4$), the operating bias $V_M$ is derived as follows:

$$I_{R3} = \frac{V_O - V_M}{R3} = \frac{V_{DD} - V_M}{R}, \tag{5}$$

$$I_{R4} = \frac{V_M}{R4} = \frac{V_M}{R},$$

$$I_C = C\frac{dV_M}{dt} = I_{R4} - I_{R3} = \frac{-2V_M + V_{DD}}{R},$$

$$\therefore C\frac{dV_M}{dt} + \frac{2V_M - V_{DD}}{R} = 0,$$

$$\frac{dV_M}{dt} + \frac{2}{RC}\left(V_M - \frac{V_{DD}}{2}\right) = 0.$$

Equation (5) is a first-order differential equation, which is expressed as $$x = V_M - \frac{V_{DD}}{2},$$

and has the solution expressed as $y=K \cdot e^{\alpha t}$ for $K=y(0)$ in generic. Let $$\frac{dy}{dt} - \alpha y = 0$$

it is derived that $dx=dV_M$ and $$x(0) = -\frac{V_{DD}}{4}.$$

Therefore, equation (5) is rewritten as:

$$\frac{dx}{dt} + \frac{2}{RC}x = 0. \tag{6}$$

From equation (6), it is known that $$x = K \cdot e^{-\frac{2t}{RC}} \text{ and } K = x(0) = -\frac{V_{DD}}{4}. \tag{7}$$

Accordingly, by taking $$x = V_M - \frac{V_{DD}}{2}$$

into equation (7), equation (8) can be obtained as:

$$V_M = \frac{V_{DD}}{4} \cdot \left(1 - e^{-\frac{2t}{RC}}\right) + \frac{V_{DD}}{4}. \tag{8}$$

Upon equations (4) and (8), the relationship between operating bias $V_M$ and time can be illustrated as shown in FIG. 5. From equations (4) and (8) and FIG. 5, it is known that the operating bias $V_M$ output by the circuit of the invention is a continuous waveform, which does not cause the pop sounds and slight noises at power-on.

While powering off, when the operating bias $V_M$ ranges from one fourth to one half of the high voltage $V_{DD}$ ($V_{DD}/4 \leq V_M \leq V_{DD}/2$), the input offset voltage $V_{OS}$ is smaller than zero ($V_{OS}<0$), the switch 310 connects the output terminal 313 to the reference voltage (VMC=$V_{DD}/3$), R1/R2=3, R3=R4=R, and the operating bias $V_M$ on the output terminal 341 is initialized at $V_{DD}/2$ volts ($V_M(0)=V_{DD}/2$), the operating bias $V_M$ is derived as follows:

$$V_O = \frac{V_{DD}}{3} + \left(1 + \frac{R1}{R2}\right) \times \left(V_M + V_{OS} - \frac{V_{DD}}{3}\right) \tag{9}$$

$$= \frac{V_{DD}}{3} + 4 \times \left(V_M + V_{OS} - \frac{V_{DD}}{3}\right),$$

$$= 4V_M + 4V_{OS} - V_{DD}$$

$$I_{R3} = \frac{V_O - V_M}{R3} = \frac{3V_M + 4V_{OS} - V_{DD}}{R},$$

$$I_{R4} = \frac{V_M}{R4} = \frac{V_M}{R},$$

$$I_C = C\frac{dV_M}{dt} = I_{R4} - I_{R3} = \frac{2V_M + 4V_{OS} - V_{DD}}{R},$$

$$C\frac{dV_M}{dt} - \frac{2V_M + 4V_{OS} - V_{DD}}{R} = 0,$$

$$\frac{dV_M}{dt} - \frac{2}{RC}\left(V_M + 2V_{OS} - \frac{V_{DD}}{2}\right) = 0.$$

Equation (9) is a first-order differential equation, which is expressed as $$\frac{dy}{dt} - \alpha y = 0$$

and has the solution expressed as $y=K \cdot e^{\alpha t}$ for $K=y(0)$ in generic. Let $$x = V_M + 2V_{OS} - \frac{V_{DD}}{2},$$

it is derived that $dx=dV_M$ and $x(0)=2V_{OS}$. Therefore, equation (9) is rewritten as:

$$\frac{dx}{dt} - \frac{2}{RC}x = 0. \quad (10)$$

From equation (10), it is known that $$x = K \cdot e^{\frac{2t}{RC}}, K = x(0) = 2V_{OS}. \quad (11)$$

Accordingly, by taking $$x = V_M + 2V_{OS} - \frac{V_{DD}}{2}$$

into equation (11), equation (12) can be obtained as:

$$V_M = 2V_{OS} \cdot \left(e^{\frac{2t}{RC}} - 1\right) + \frac{V_{DD}}{2}. \quad (12)$$

While powering off, when the operating bias $V_M$ is greater than or equal to zero and smaller than one fourth of the high voltage $V_{DD}$ ($0 \leq V_M < V_{DD}/4$), the input offset voltage $V_{OS}$ is smaller than zero ($V_{OS}<0$), the switch 310 connects the output terminal 313 to the low voltage (VMC=$V_{DD}/3$), R1/R2=3, R3=R4=R, and the operating bias $V_M$ on the output terminal 341 is initialized at $V_{DD}/4$ volts ($V_M(0)=V_{DD}/4$), the operating bias $V_M$ is derived as follows:

$$I_{R3} = \frac{V_O - V_M}{R3} = \frac{-V_M}{R}, \quad (13)$$

$$I_{R4} = \frac{V_M}{R4} = \frac{V_M}{R},$$

$$I_C = C\frac{dV_M}{dt} = I_{R4} - I_{R3} = \frac{-2V_M}{R},$$

$$C\frac{dV_M}{dt} + \frac{2V_M}{R} = 0,$$

$$\frac{dV_M}{dt} + \frac{2}{RC}V_M = 0.$$

Equation (9) is a first-order differential equation, which is expressed as $dy/dt - \alpha y = 0$ and has the solution expressed as $y = K \cdot e^{\alpha t}$ for $K=y(0)$ in generic. For $$V_M = K \cdot e^{-\frac{2t}{RC}}, K = V_M(0) = \frac{V_{DD}}{4},$$

equation (14) is obtained as follows:

$$V_M = \frac{V_{DD}}{4} \cdot e^{-\frac{2t}{RC}}. \quad (14)$$

Figure 6:
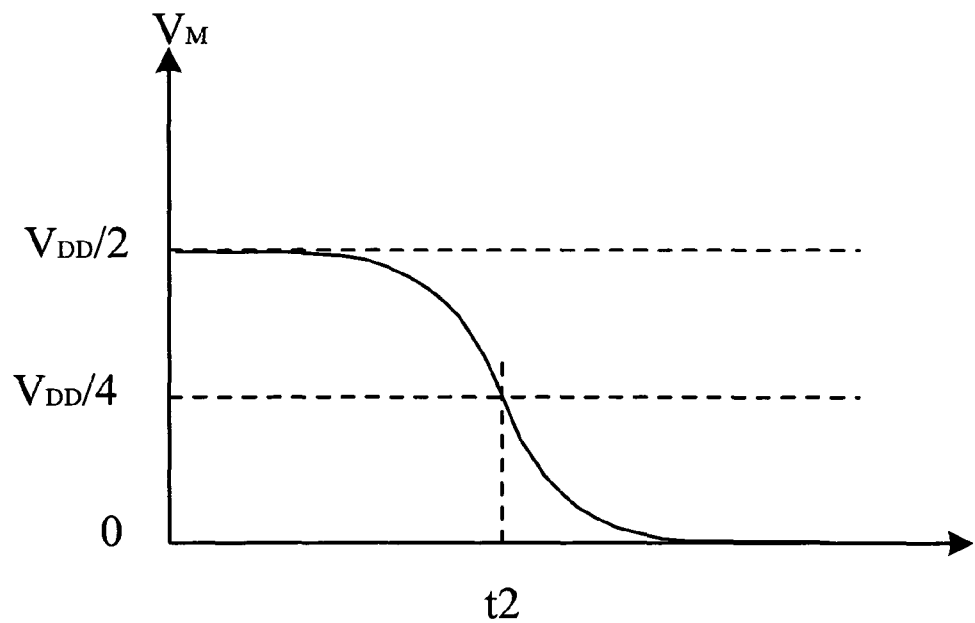
FIG. 6 is a schematic graph of an operating bias computed at power off in accordance with the invention.

Upon equations (12) and (14), the relationship between the operating bias $V_M$ and time can be illustrated as shown in FIG. 6. From equations (12) and (14) and FIG. 6, it is known that the operating bias $V_M$ output by the circuit of the invention is a continuous waveform, which does not cause the pop sounds and slight noises at power-on.

Figure 7:
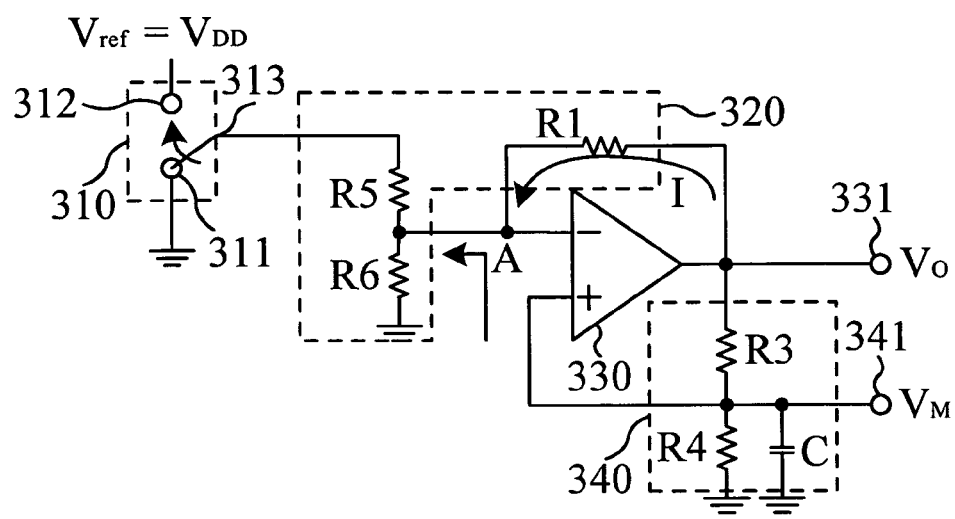
FIG. 7 is a circuit diagram of another embodiment of the invention.

FIG. 7 is a circuit diagram of another embodiment of the invention. In FIG. 7, as compared to FIG. 3, the reference voltage is changed from $V_{DD}/3$ to $V_{DD}$. In addition, the fifth resistor R5 and the first resistor R1 have the same value, and the value of the sixth resistor R6 is half of the fifth resistor R5, i.e., R5/R6=2. The circuit left to point A is a Thevenin's circuit equivalent to that of FIG. 3 to thereby change the reference voltage Vref into $V_{DD}$ for conveniently integrating it into a same integrated circuit.

In view of the foregoing, it is known that the invention can eliminate the pop sounds and the slight noises caused by the DAC at power on and off in the prior art. The invention uses the operational amplifier, the resistors and the capacitor to replace the DAC used in the prior art, which can save the cost and gain the better response speed to thereby power on and off rapidly.

Although the present invention has been explained in relation to its preferred embodiment, it is to be understood that many other possible modifications and variations can be made without departing from the spirit and scope of the invention as hereinafter claimed.

What is claimed is:

1. A circuit for eliminating pop sounds at power on and off, comprising:
   a switch, which has a first input terminal connected to a low voltage and a second input terminal connected to a reference voltage for switching at power on or off;
   a feedback network, which is connected to the switch in order to provide a feedback current and comprised of a first resistor and a second resistor, the second resistor having a first terminal connected to the switch and a second terminal connected to a first terminal of the first resistor;
   an operational amplifier, which has a negative input terminal connected to the first terminal of the first resistor and the second terminal of the second resistor and has an output terminal connected to a second terminal of the first resistor; and
   an output network, which has an output terminal, a third resistor, a fourth resistor and a capacitor, the third resistor having a first terminal connected to the output terminal of the operational amplifier and a second terminal connected to the output terminal of the output network, a first terminal of the fourth resistor, a first terminal of the capacitor and a positive input terminal of the operational amplifier, the fourth resistor having a second terminal connected to the low voltage, the capacitor having a second terminal connected to the low voltage;
   wherein, when the switch is connected to the low voltage, the output terminal of the output network provides an operating bias, which is gradually increased, to the circuit, and the output terminal of the output network provides the operating bias, which is gradually reduced, to the circuit when the switch is connected to the reference voltage.

2. The circuit as claimed in claim 1, wherein the first resistor has a value triple of that of the second resistor.

3. The circuit as claimed in claim 2, wherein the third resistor has a value same as that of the fourth resistor.

4. The circuit as claimed in claim 3, wherein the reference voltage is one third of a high voltage.

5. The circuit as claimed in claim 4, wherein the operating bias is an exponential function of time when the switch is connected to the low voltage.

6. The circuit as claimed in claim 5, wherein the operating bias which is greater than or equal to zero and smaller than one fourth of the high voltage, the operating bias is expressed as $$2V_{OS} \cdot \left(e^{\frac{2t}{RC}} - 1\right),$$

where $V_{OS}$ indicates an input offset voltage of the operational amplifier, R indicates the value of the third resistor and C indicates a value of the capacitor.

7. The circuit as claimed in claim 5, wherein the operating bias which ranges from one fourth of the high voltage to one half of the high voltage is expressed as $$\frac{V_{DD}}{4} \cdot \left(1 - e^{-\frac{2t}{RC}}\right) + \frac{V_{DD}}{4},$$

where $V_{DD}$ indicates the high voltage.

8. The circuit as claimed in claim 4, wherein the operating bias is an exponential function of time when the switch is connected to the reference voltage.

9. The circuit as claimed in claim 8, wherein the operating bias which ranges from one fourth of the high voltage to one half of the high voltage is expressed as $$2V_{OS} \cdot \left(e^{\frac{2t}{RC}} - 1\right) + \frac{V_{DD}}{2},$$

where $V_{OS}$ indicates an input offset voltage of the operational amplifier, R indicates the value of the third resistor and C indicates a value of the capacitor.

10. The circuit as claimed in claim 9, wherein the operating bias which is greater than or equal to zero and smaller than one fourth of the high voltage is expressed as $$\frac{V_{DD}}{4} \cdot e^{-\frac{2t}{RC}},$$

where $V_{DD}$ indicates the high voltage.

11. A circuit for eliminating pop sounds at power on and off, comprising:
a switch, which has a first input terminal connected to a low voltage and a second input terminal connected to a reference voltage for switching at power on or off;
a feedback network, which is connected to the switch to provide a feedback current and includes a first resistor, a second resistor and a fifth resistor, the second resistor having a first terminal connected to the switch and a second terminal connected to first terminals of the first resistor and the fifth resistor, the fifth resistor having a second terminal connected to the low voltage;
an operational amplifier, which has a negative input terminal connected to the first terminal of the first resistor, the second terminal of the second resistor and the first terminal of the fifth resistor, and has an output terminal connected to a second terminal of the first resistor; and
an output network, which has an output terminal, a third resistor, a fourth resistor and a capacitor, the third resistor having a first terminal connected to the output terminal of the operational amplifier and a second terminal connected to the output terminal of the output network, a first terminal of the fourth resistor, a first terminal of the capacitor and a positive input terminal of the operational amplifier, the fourth resistor having a second terminal connected to the low voltage, the capacitor having a second terminal connected to the low voltage;
wherein, when the switch is connected to the low voltage, the output terminal of the output network provides an operating bias, which is gradually increased, to the circuit, and the output terminal of the output network provides the operating bias, which is gradually reduced, to the circuit when the switch is connected to the reference voltage.

12. The circuit as claimed in claim 11, wherein the first resistor has value same as that of the second resistor.

13. The circuit as claimed in claim 12, wherein the fifth resistor has a value half of that of the second resistor.

14. The circuit as claimed in claim 13, wherein the third resistor has a value same as that of the fourth resistor.

15. The circuit as claimed in claim 14, wherein the reference voltage is same as a high voltage.

16. The circuit as claimed in claim 15, wherein the operating bias is an exponential function of time when the switch is connected to the low voltage.

* * * * *